(12) United States Patent
Chang et al.

(10) Patent No.: US 12,256,573 B2
(45) Date of Patent: Mar. 18, 2025

(54) SENSOR PACKAGE STRUCTURE

(71) Applicant: TONG HSING ELECTRONIC INDUSTRIES, LTD., Taipei (TW)

(72) Inventors: Chia-Shuai Chang, Hsin-Chu County (TW); Chien-Hung Lin, Taipei (TW); Wen-Fu Yu, Taipei (TW); Wei-Li Wang, Taipei (TW); Bae-Yinn Hwang, Taipei (TW); Jyun-Huei Jiang, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 183 days.

(21) Appl. No.: 18/206,158

(22) Filed: Jun. 6, 2023

(65) Prior Publication Data
US 2024/0290897 A1    Aug. 29, 2024

(30) Foreign Application Priority Data
Feb. 23, 2023  (TW) .................. 112106566

(51) Int. Cl.
| H10F 19/20 | (2025.01) |
| H01L 23/00 | (2006.01) |
| H01L 23/31 | (2006.01) |
| H10F 19/80 | (2025.01) |
| H10F 77/30 | (2025.01) |

(52) U.S. Cl.
CPC .......... *H10F 19/20* (2025.01); *H01L 23/3114* (2013.01); *H01L 23/3142* (2013.01); *H01L 24/45* (2013.01); *H10F 19/80* (2025.01); *H10F 77/334* (2025.01)

(58) Field of Classification Search
CPC . H01L 23/3114; H01L 23/3142; H01L 24/45; H10F 19/20; H10F 19/80; H10F 77/334
See application file for complete search history.

(56) References Cited

U.S. PATENT DOCUMENTS

| 8,854,535 | B2 * | 10/2014 | Cellier | ................... | H04N 23/71 |
| | | | | | 348/362 |
| 11,223,763 | B2 * | 1/2022 | Yang | ..................... | G01J 1/4204 |
| 2010/0200898 | A1 * | 8/2010 | Lin | ................... | H01L 27/14632 |
| | | | | | 257/E31.11 |
| 2012/0235308 | A1 * | 9/2012 | Takahashi | ............. | H10F 39/804 |
| | | | | | 438/109 |

(Continued)

*Primary Examiner* — Amy R Hsu
(74) *Attorney, Agent, or Firm* — Li & Cai Intellectual Property (USA) Office

(57) ABSTRACT

A sensor package structure includes a substrate, a sensor chip disposed on and electrically coupled to the substrate, a plurality of adhesive rings disposed on the sensor chip, a plurality of filtering lenses respectively adhered to the adhesive rings, and an encapsulant that surrounds the above components. A sensing region of the sensor chip has a layout boundary and a plurality of sub-regions that are defined by the layout boundary and that are separate from each other. The adhesive rings are disposed on the sensing region, and each of the adhesive rings surrounds one of the sub-regions. Each of the filtering lenses, a corresponding one of the adhesive rings, and a corresponding one of the sub-regions jointly define a buffering space. The encapsulant is formed on the substrate and covers the layout boundary of the sensor chip.

20 Claims, 15 Drawing Sheets

(56) References Cited

U.S. PATENT DOCUMENTS

| | | | |
|---|---|---|---|
| 2017/0140202 A1* | 5/2017 | Huang | G06V 40/1329 |
| 2019/0122990 A1* | 4/2019 | Shin | H01L 24/92 |
| 2019/0386206 A1* | 12/2019 | Schaller | H10N 50/01 |
| 2021/0050459 A1 | 2/2021 | Kummerl et al. | |
| 2024/0243207 A1* | 7/2024 | Tsai | H10F 77/50 |

* cited by examiner

SENSOR PACKAGE STRUCTURE

CROSS-REFERENCE TO RELATED PATENT APPLICATION

This application claims the benefit of priority to Taiwan Patent Application No. 112106566, filed on Feb. 23, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor package structure, and more particularly to an ambient light sensor package structure.

BACKGROUND OF THE DISCLOSURE

When a sensing region of conventional sensor package structure is required to sense lights of different wavelengths, a filtering configuration of the conventional sensor package structure needs to be carefully manufactured through cumbersome processes, such as to incur a high manufacturing cost for the conventional sensor package structure. Moreover, when a part of the filtering configuration corresponding to one of the wavelengths has a defect, the entire conventional sensor package structure has to be reworked or disposed of.

SUMMARY OF THE DISCLOSURE

In response to the above-referenced technical inadequacies, the present disclosure provides a sensor package structure to effectively improve on the issues associated with conventional sensor package structures.

In order to solve the above-mentioned problems, one of the technical aspects adopted by the present disclosure is to provide a sensor package structure, which includes a substrate, a sensor chip, a plurality of adhesive rings, a plurality of filtering lenses, and an encapsulant. The sensor chip is disposed on and electrically coupled to the substrate. Moreover, a top surface of the sensor chip includes a sensing region and a peripheral region that is arranged outside of the sensing region. The sensing region defines a layout boundary and a plurality of sub-regions that are defined by the layout boundary and that are separate from each other. The adhesive rings are disposed on the sensing region, and each of the adhesive rings surrounds one of the sub-regions. The filtering lenses are respectively adhered to the adhesive rings. Each of the filtering lenses, a corresponding one of the adhesive rings, and a corresponding one of the sub-regions jointly define a buffering space. Moreover, M represents a quantity of the filtering lenses, and the filtering lenses are configured to allow lights having N number of different wavelengths to pass therethrough, where M and N are positive integers greater than one, and M is greater than or equal to N. The encapsulant is formed on the substrate and covers the peripheral region and the layout boundary of the sensor chip. The sensor chip, the adhesive rings, and the filtering lenses are embedded in the encapsulant, and at least part of an outer surface of each of the filtering lenses is exposed from the encapsulant.

In order to solve the above-mentioned problems, another one of the technical aspects adopted by the present disclosure is to provide a sensor package structure, which includes a substrate, a sensor chip, a plurality of adhesive rings, a plurality of filtering lenses, and a light absorption layer. The sensor chip is disposed on and electrically coupled to the substrate. Moreover, a top surface of the sensor chip includes a sensing region and a peripheral region that is arranged outside of the sensing region. The sensing region defines a layout boundary and a plurality of sub-regions that are defined by the layout boundary and that are separate from each other. The adhesive rings are disposed on the sensing region, and each of the adhesive rings surrounds one of the sub-regions. The filtering lenses are respectively adhered to the adhesive rings. Each of the filtering lenses, a corresponding one of the adhesive rings, and a corresponding one of the sub-regions jointly define a buffering space. Moreover, a quantity of the filtering lenses is M in number, the filtering lenses are configured to allow lights having N number of different wavelengths to pass therethrough, where M and N are positive integers greater than one, and M is greater than or equal to N. The light absorption layer is formed on the layout boundary of the sensor chip. Moreover, a surrounding lateral surface of each of the filtering lenses and an outer lateral edge of each of the adhesive rings are covered by the light absorption layer.

Therefore, in the sensor package structure provided by the present disclosure, the filtering lenses are respectively disposed on the sub-regions of the sensor chip through adhesive rings, so that a sensing requirement for one kind of light can be met by one of the filtering lenses, thereby reducing the complexity and cost of manufacturing the sensor package structure under the condition that the sensing requirements of the sensor chip are met.

Moreover, in each of the filtering lenses, the corresponding adhesive ring, and the corresponding sub-region of the sensor package structure provided by the present disclosure, the adhesive ring has a larger coefficient of thermal expansion (CTE), and the buffering space can receive a thermal expansion portion of the adhesive ring, thereby preventing the filtering lens and the sub-region from being damaged by being squeezed as a result of thermal expansion of the adhesive ring.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
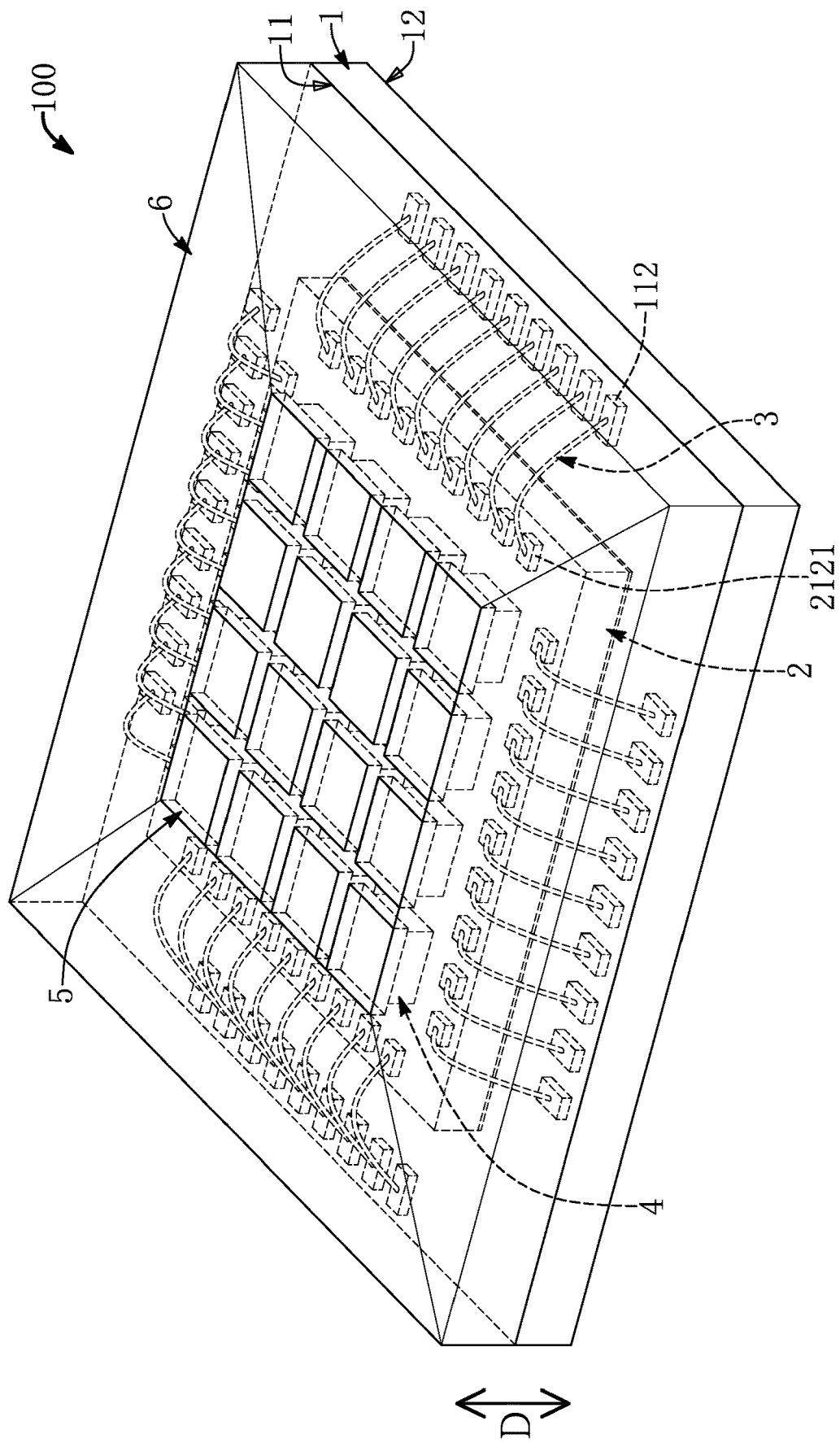
FIG. 1 is a schematic perspective view of a sensor package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
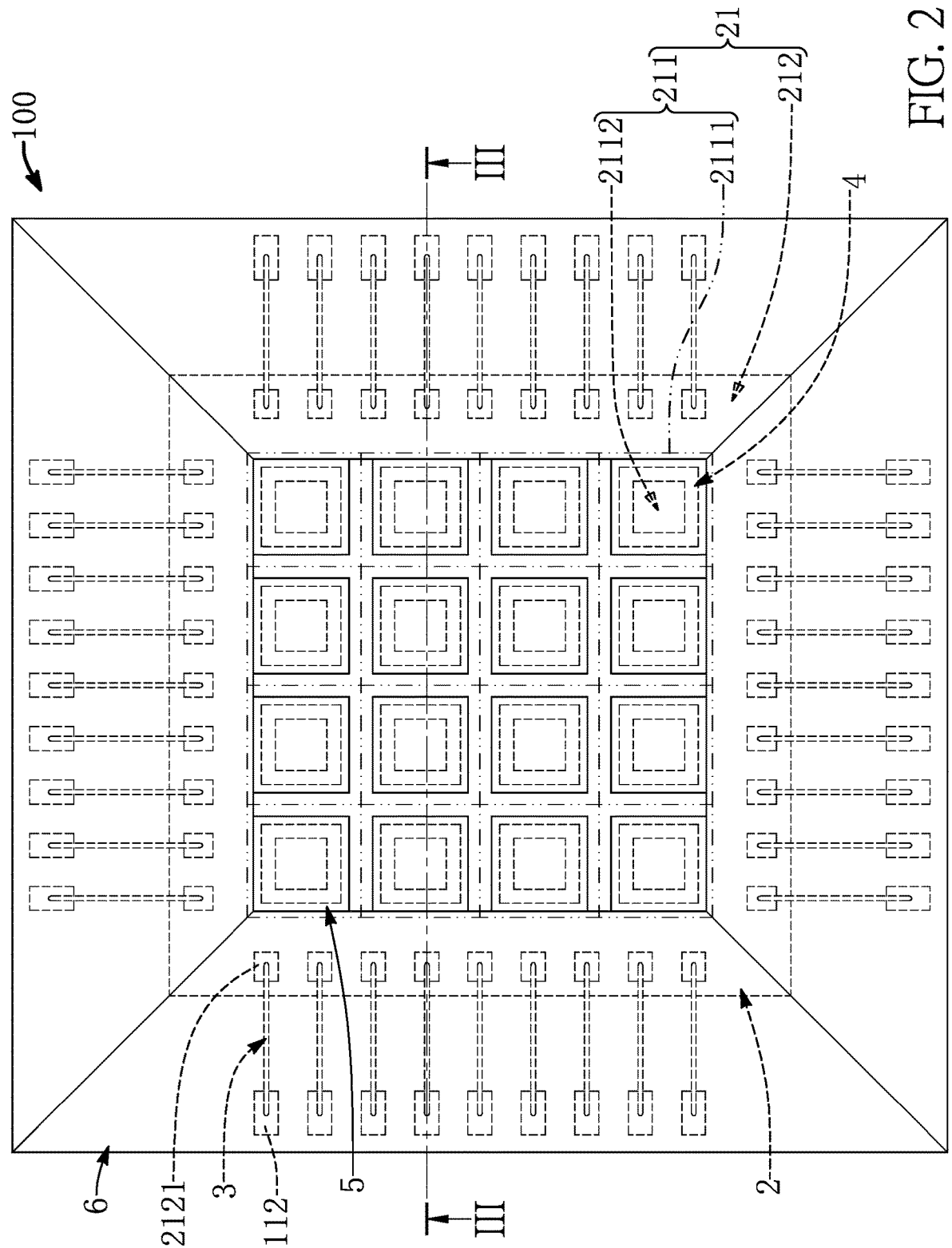
FIG. 2 is a schematic top view of FIG. 1.
Figure 3:
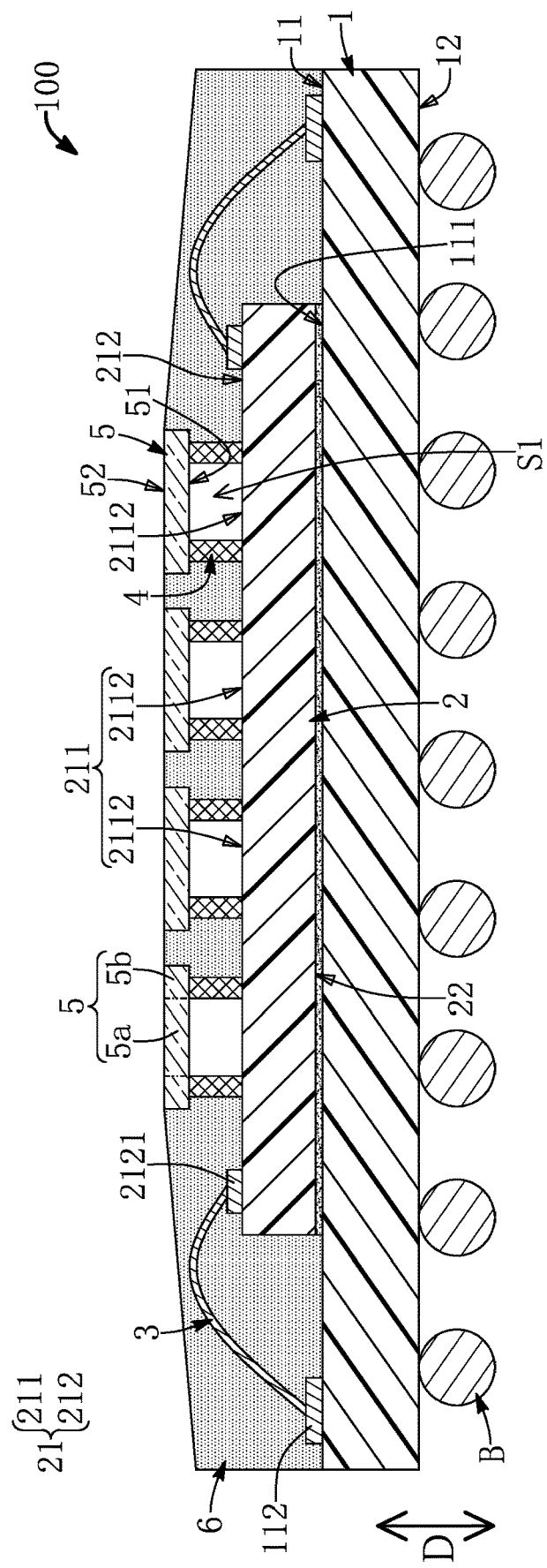
FIG. 3 is a schematic cross-sectional view taken along line III-III of FIG. 2.

Referring to FIG. 1 to FIG. 3, a first embodiment of the present disclosure is provided. As shown in FIG. 1, the present disclosure provides a sensor package structure 100, and more particularly to an ambient light sensor package structure, but the present disclosure is not limited thereto. In other words, any package structure not encapsulating a sensor chip therein has a structural design different from that of the sensor package structure 100 of the present embodiment.

As shown in FIG. 1 to FIG. 3, the sensor package structure 100 includes a substrate 1, a sensor chip 2 disposed on the substrate 1, a plurality of metal wires 3 electrically coupled to the sensor chip 2 and the substrate 1, a plurality of adhesive rings 4 disposed on the sensor chip 2, a plurality of filtering lenses 5 respectively adhered to the adhesive rings 4, and an encapsulant 6 that is formed on the substrate 1.

The sensor package structure 100 in the present embodiment includes the above components, but can be adjusted or changed according to design requirements. For example, in other embodiments of the present disclosure not shown in the drawings, the sensor package structure 100 can be provided without the metal wires 3, and the sensor chip 2 is fixed onto and electrically coupled to the substrate 1 in a flip-chip manner. The structure and connection relationship of each component of the sensor package structure 100 will be described in the following description.

The substrate 1 of the present embodiment has a square shape or a rectangular shape, but the present disclosure is not limited thereto. An upper surface 11 of the substrate 1 includes a chip-bonding region 111 arranged approximately on a center portion thereof, and the substrate 1 includes a plurality of bonding pads 112 that are disposed on the upper surface 11 and are arranged outside of the chip-bonding region 111. The bonding pads 112 in the present embodiment are substantially in a ring-shaped arrangement, but the present disclosure is not limited thereto. For example, in other embodiments of the present disclosure not shown in the drawings, the bonding pads 112 can be arranged in two rows respectively at two opposite sides of the chip-bonding region 111.

In addition, the substrate 1 can be further provided with a plurality of solder balls B disposed on a lower surface 12 thereof. The substrate 1 can be soldered onto an electronic component (not shown in the drawings) through the solder balls B, thereby electrically connecting the sensor package structure 100 to the electronic component.

The sensor chip 2 in the present embodiment has a square shape or a rectangular shape, and is an image sensor chip, but the present disclosure is not limited thereto. A bottom surface 22 of the sensor chip 2 is fixed onto the chip-bonding region 111 of the substrate 1 (through a chip-bonding adhesive along a predetermined direction D). In other words, the sensor chip 2 is arranged to be surrounded on the inside of the bonding pads 112. Moreover, a top surface 21 of the sensor chip 2 has a sensing region 211 and a peripheral region 212 that is arranged outside of the sensing region 211. Two ends of each of the metal wires 3 are respectively connected to the substrate 1 and the peripheral region 212 of the sensor chip 2, so that the substrate 1 and the sensor chip 2 are electrically coupled to each other.

In the present embodiment, the sensor chip 2 includes a plurality of connection pads 2121 arranged on the peripheral region 212. In other words, the connection pads 2121 are arranged outside of the sensing region 211. The number and positions of the connection pads 2121 of the sensor chip 2 in the present embodiment correspond to those of the bonding pads 112 of the substrate 1. In other words, the peripheral region 212 in the present embodiment surrounds the sensing region 211, and the connection pads 2121 are substantially in a ring-shaped arrangement. Moreover, the two ends of each of the metal wires 3 are respectively connected to one of the bonding pads 112 and the corresponding connection pad 2121.

Specifically, the sensing region 211 defines a layout boundary 2111 and a plurality of sub-regions 2112 that are defined by the layout boundary 2111 and that are separate from each other. In the present embodiment, the layout boundary 2111 is substantially in a checkerboard shape, such that the sub-regions 2112 have substantially the same size and are in a matrix arrangement, but the present disclosure is not limited thereto. For example, in other embodiments of the present disclosure not shown in the drawings, the layout boundary 2111 can be changed or adjusted according to design requirements, and the sub-regions 2112 can have different sizes.

The adhesive rings 4 are disposed on the sensing region 211, and each of the adhesive rings 4 surrounds one of the sub-regions 2112. In other words, the adhesive rings 4 can be arranged along the layout boundary 2111. The adhesive rings 4 can be a tape in a solid state for directly adhering to the sensing region 211; or, the adhesive rings 4 can be a colloid disposed on the sensing region 211 and being solidified, but the present disclosure is not limited thereto.

Moreover, a quantity of the adhesive rings 4 is equal to a quantity of the filtering lenses 5, and inner surfaces 51 of the filtering lenses 5 are respectively adhered to the adhesive rings 4, so that each of the filtering lenses 5, a corresponding one of the adhesive rings 4, and a corresponding one of the sub-regions 2112 jointly define a buffering space 21 that is enclosed and that is filled with air. In other words, any package structure not having a space between a filtering lens and a sensing region thereof is different from the sensor package structure 100 of the present embodiment.

Accordingly, in each of the filtering lenses 5, the corresponding adhesive ring 4, and the corresponding sub-region 2112 of the sensor package structure 100 provided by the present embodiment, the adhesive ring 4 has a larger coefficient of thermal expansion (CTE), and the buffering space S1 can receive a thermal expansion portion of the adhesive ring 4, thereby preventing the filtering lens 5 and the sub-region 2112 from being damaged by being squeezed as a result of the thermal expansion of the adhesive ring 4.

It should be noted that N represents a quantity of the sub-regions 2112 of the sensing region 211, M represents a quantity of the filtering lenses 5, and the filtering lenses 5 are configured to allow lights having N number of different wavelengths to pass therethrough. In other words, the filtering lenses 5 has N number of filtering configurations different from each other. Moreover, L, M, and N are positive integers greater than one, L is greater than or equal to M, and M is greater than or equal to N. The filtering lenses 5 in the present embodiment include, but is not limited to, at least one of a near-infrared light filtering lens, a red light filtering lens, a green light filtering lens, and a blue light filtering lens. In other embodiments of the present disclosure, the filtering lens 5 can correspond to light of wavelength other than that of the above lights.

In the present embodiment, L is equal to M (e.g., any one of the sub-regions 2112 carries or is provided with one of the adhesive rings 4 and one of the filtering lenses 5), and M is equal to N (e.g., any two of the filtering lenses 5 are respectively configured to allow lights of different wavelengths to pass therethrough), but the present disclosure is not limited thereto. For example, in other embodiments of the present disclosure not shown in the drawings, M can be greater than N. In other words, at least two of the filtering lenses 5 enable lights of same wavelength to pass therethrough according to design requirements.

The encapsulant 6 is formed on the upper surface 11 of the substrate 1, and edges of the encapsulant 6 are flush with edges of the substrate 1. The metal wires 3, the sensor chip 2, the adhesive rings 4, and the filtering lenses 5 are embedded in the encapsulant 6, and at least part of an outer surface 52 of each of the filtering lenses 5 is exposed from the encapsulant 6.

Specifically, each of the filtering lenses 5 has a light-permeable segment 5a and an assembling segment 5b that surrounds the light-permeable segment 5a, and each of the filtering lenses 5 is adhered to the corresponding adhesive ring 4 through the assembling segment 5b thereof. In the present embodiment, the encapsulant 6 is connected to and covers the peripheral region 212 and the layout boundary 2111 of the sensor chip 2, and the encapsulant 6 is connected to and covers lateral surfaces and a bottom surface of the assembling segment 5b of each of the filtering lenses 5. Moreover, the outer surface 52 of each of the filtering lenses 5 is exposed from the encapsulant 6.

The encapsulant 6 of the present embodiment is opaque for blocking a visible light from passing therethrough. The encapsulant 6 is a liquid encapsulation, but the present disclosure is not limited thereto. For example, in other embodiments of the present disclosure not shown in the drawings, the encapsulant 6 can be a molding encapsulant.

In summary, in the sensor package structure 100 provided by the present embodiment, the filtering lenses 5 are respectively disposed on the sub-regions 2112 of the sensor chip 2 through adhesive rings 4, so that a sensing requirement for one kind of light can be met by one of the filtering lenses 5, thereby reducing the complexity and cost of manufacturing the sensor package structure 100 under the condition that the sensing requirements of the sensor chip 2 are met.

Second Embodiment

Figure 4:
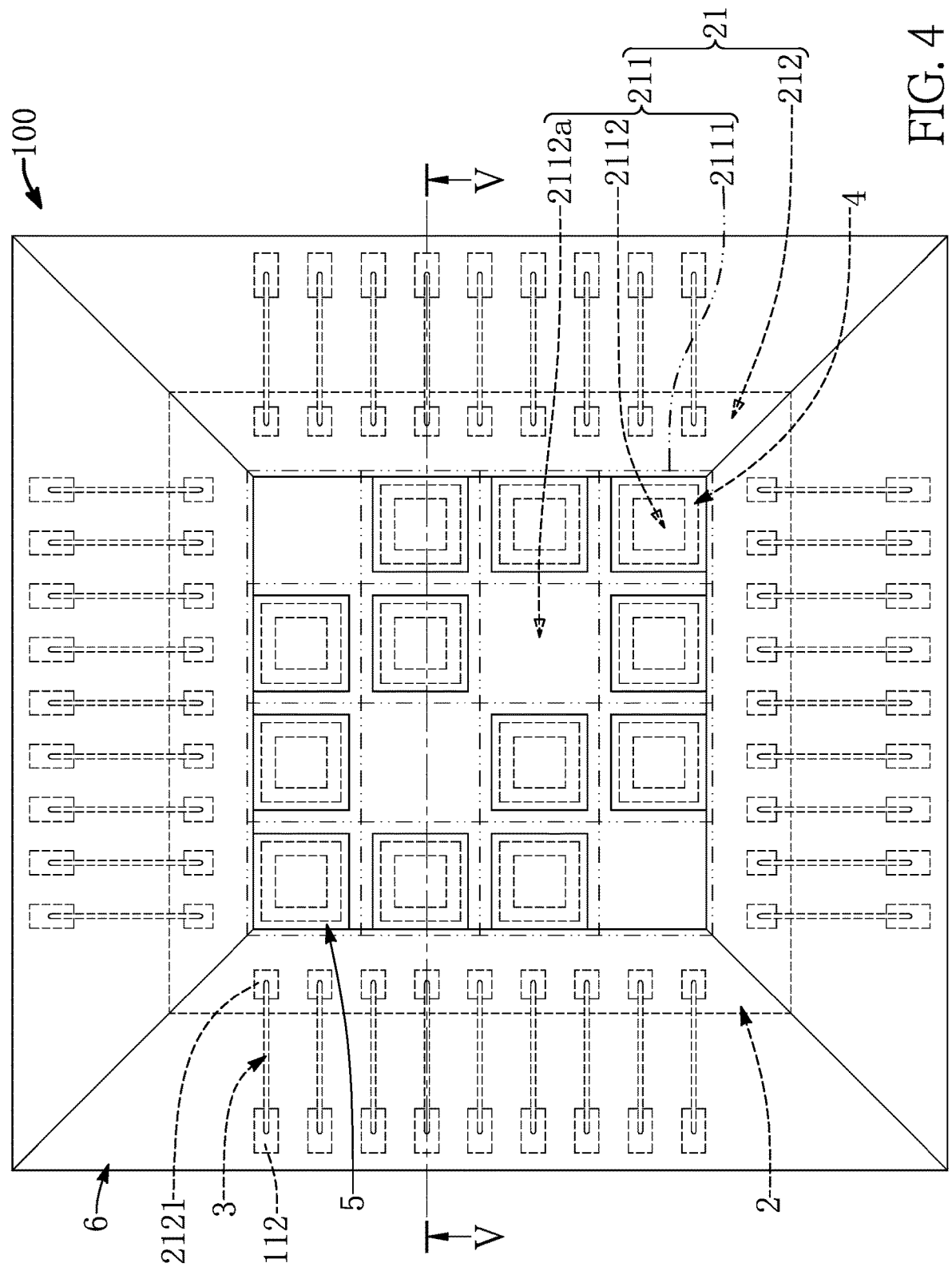
FIG. 4 is a schematic top view of the sensor package structure according to a second embodiment of the present disclosure.
Figure 5:
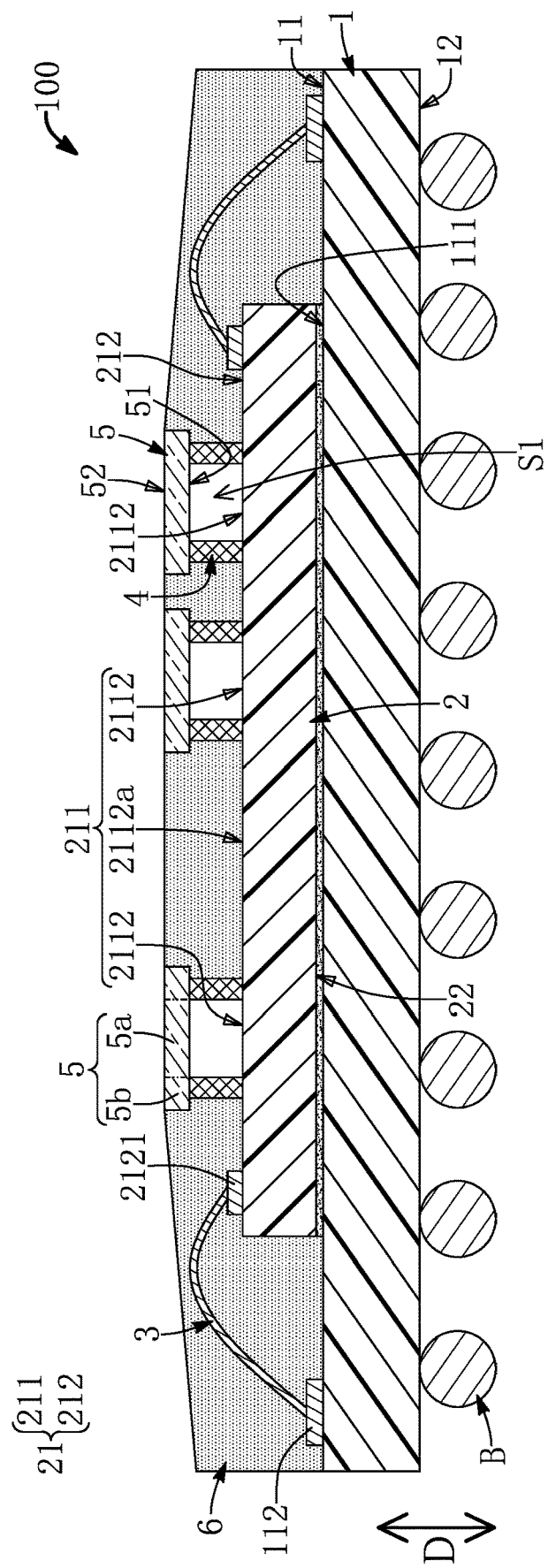
FIG. 5 is a schematic cross-sectional view taken along line V-V of FIG. 4.

Referring to FIG. 4 and FIG. 5, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, a quantity of the sub-regions 2112 is greater than a quantity of the filtering lenses 5 (i.e., L is greater than M). In other words, at least one of the sub-regions 2112a can be provided to have no sensing requirement and does not have the adhesive rings 4 and the filtering lenses 5 disposed thereon. Specifically, at least one of the sub-regions 2112a that does not have the adhesive rings 4 and the filtering lenses 5 disposed thereon is covered by the encapsulant 6.

Third Embodiment

Figure 6:
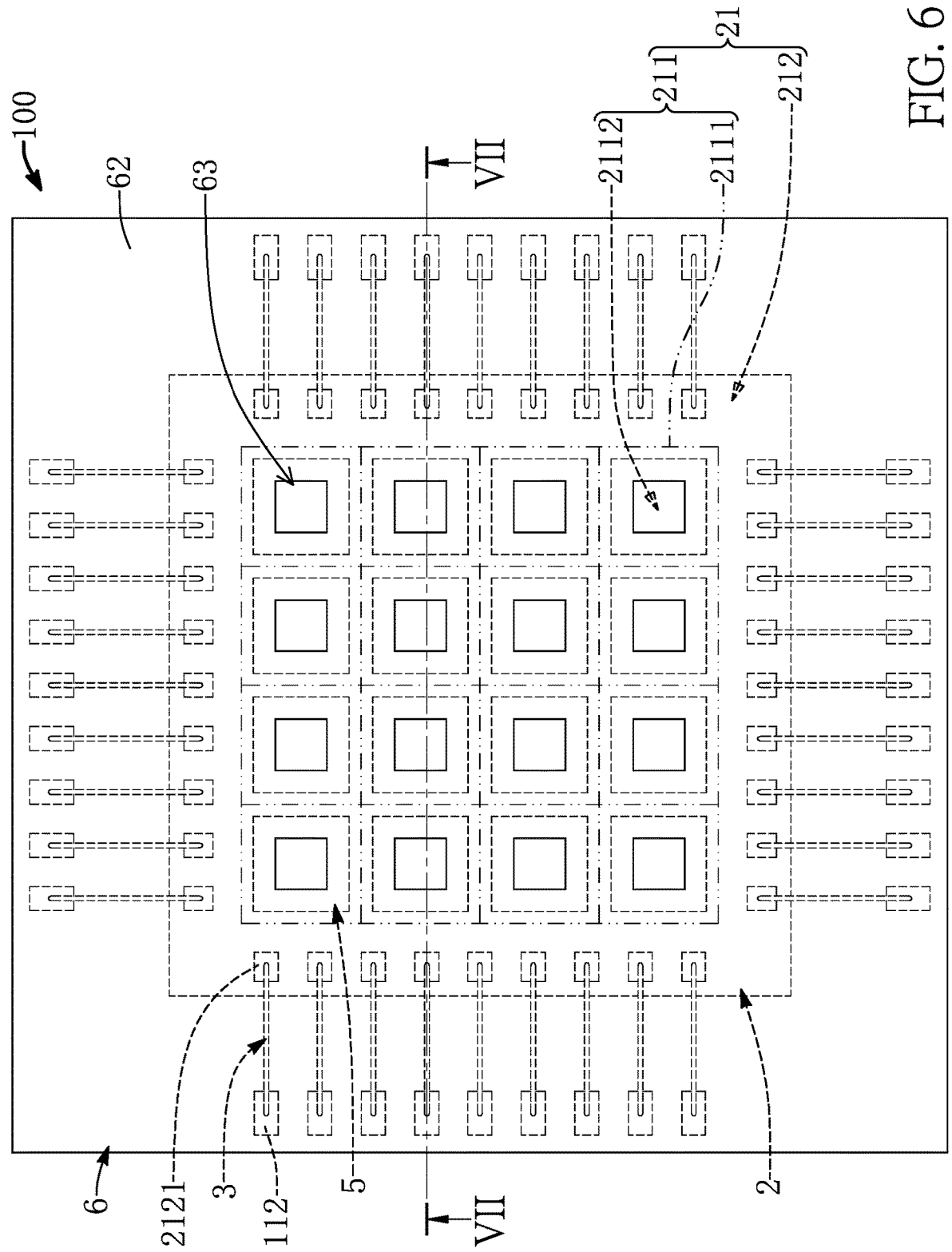
FIG. 6 is a schematic top view of the sensor package structure according to a third embodiment of the present disclosure.
Figure 7:
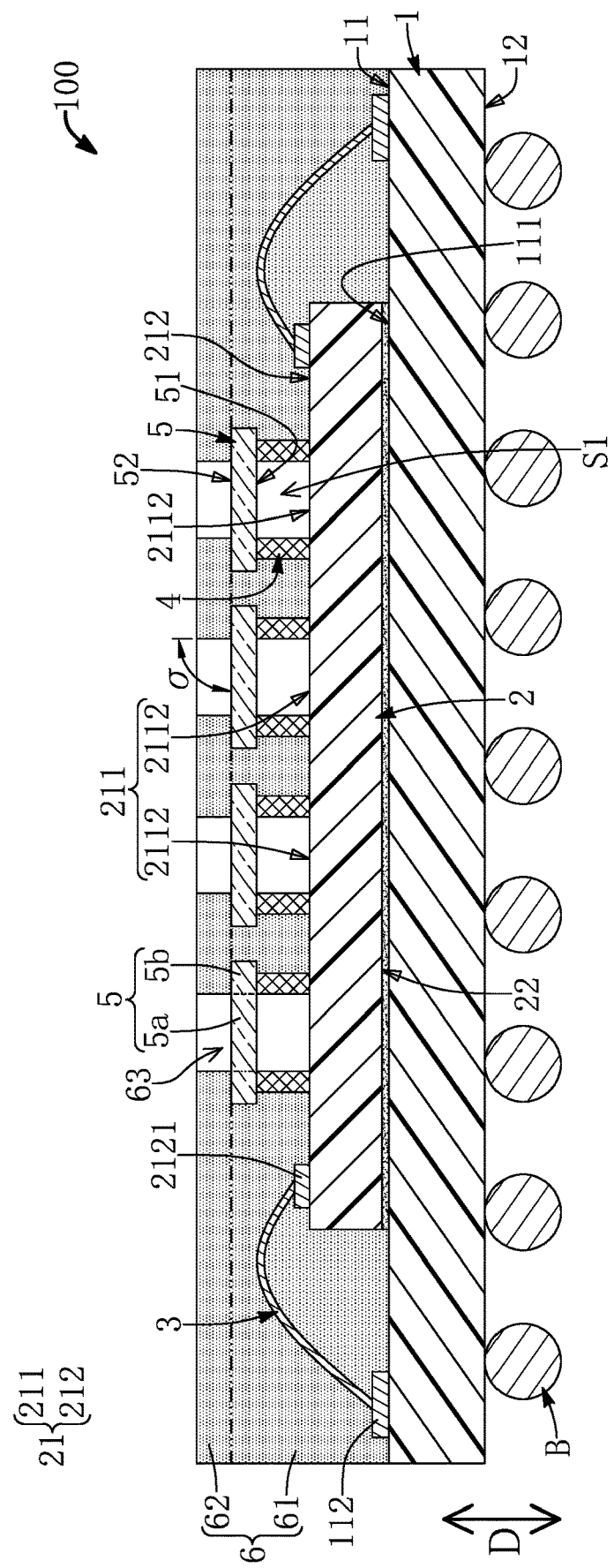
FIG. 7 is a schematic cross-sectional view taken along line VII-VII of FIG. 6.

Referring to FIG. 6 and FIG. 7, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the encapsulant 6 includes a main portion 61 formed on the substrate 1 and an extension portion 62 that extends from the main portion 61 along a direction away from the substrate 1. The shape and volume of the main portion 61 in the present embodiment are substantially identical to those of the encapsulant 6 disclosed in the first embodiment (as shown in FIG. 3).

Moreover, the extension portion 62 protrudes from the outer surfaces 52 of the filtering lenses 5, so that the extension portion 62 and the outer surface 52 of each of the filtering lenses 5 jointly define a light-permeable slot 63. In other words, the encapsulant 6 covers the assembling segment 5b of each of the filtering lenses 5 by forming the extension portion 62 (e.g., in each of the filtering lenses 5, a part of the outer surface 52 arranged on the assembling segment 5b is covered by the extension portion 62), but is not in contact with the light-permeable segment 5a.

In addition, an inner side wall and a bottom wall of each of the light-permeable slots 63 have an angle σ therebetween that is greater than or equal to 90 degrees, thereby effectively controlling an angle of light traveling into the corresponding filtering lens 5. Moreover, the adhesive rings 4 in the present embodiment are preferably arranged in a projection space defined by orthogonally projecting the extension portion 62 toward the top surface 21 of the sensor chip 2 along the predetermined direction D. Accordingly, each of the adhesive rings 4 can be shielded along the predetermined direction D by the extension portion 62, such that the flare phenomenon of the sensor package structure 100 caused by light reflected from any one of the adhesive rings 4 can be effectively reduced.

Fourth Embodiment

Figure 8:
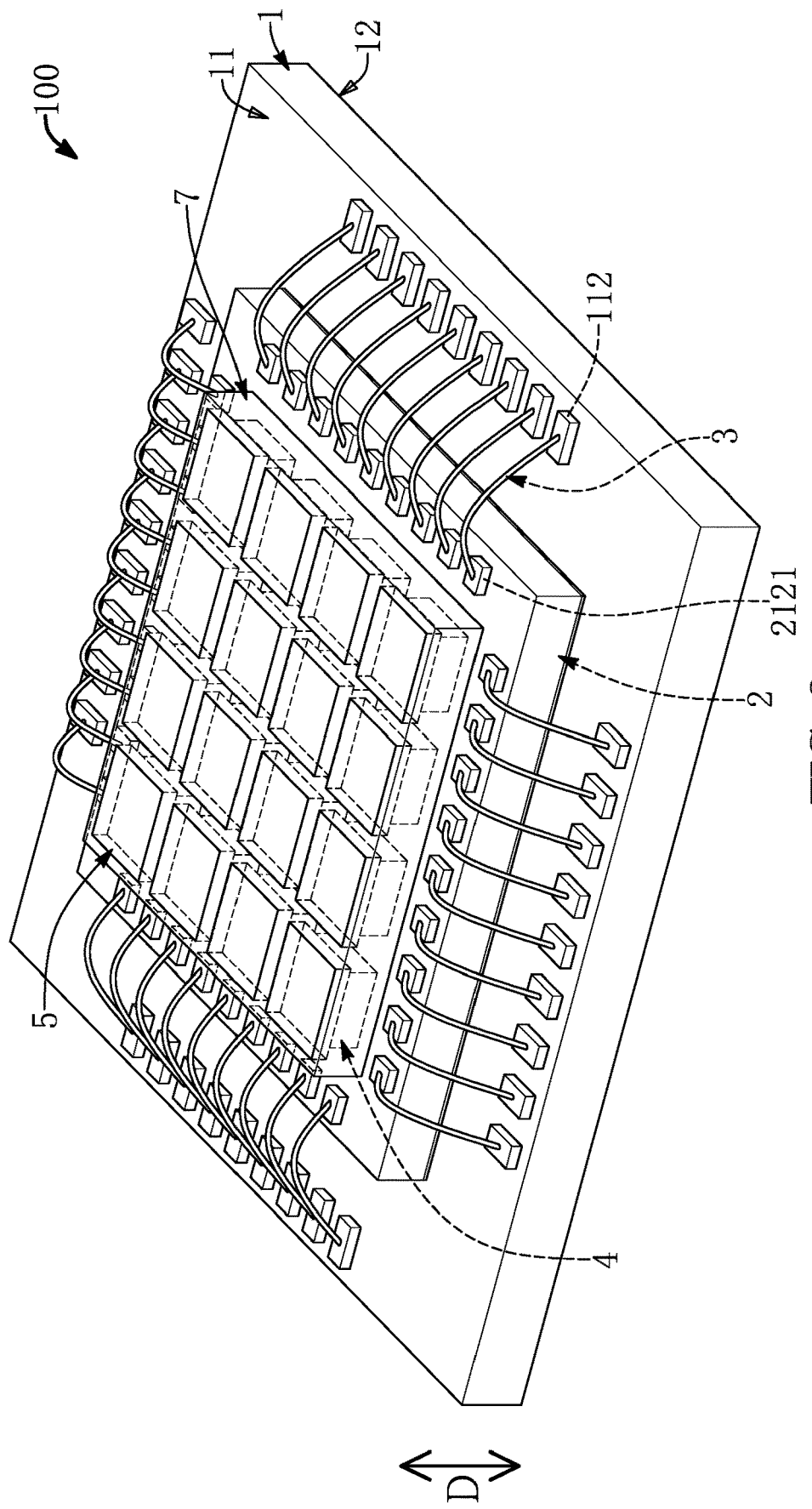
FIG. 8 is a schematic perspective view of the sensor package structure according to a fourth embodiment of the present disclosure.
Figure 9:
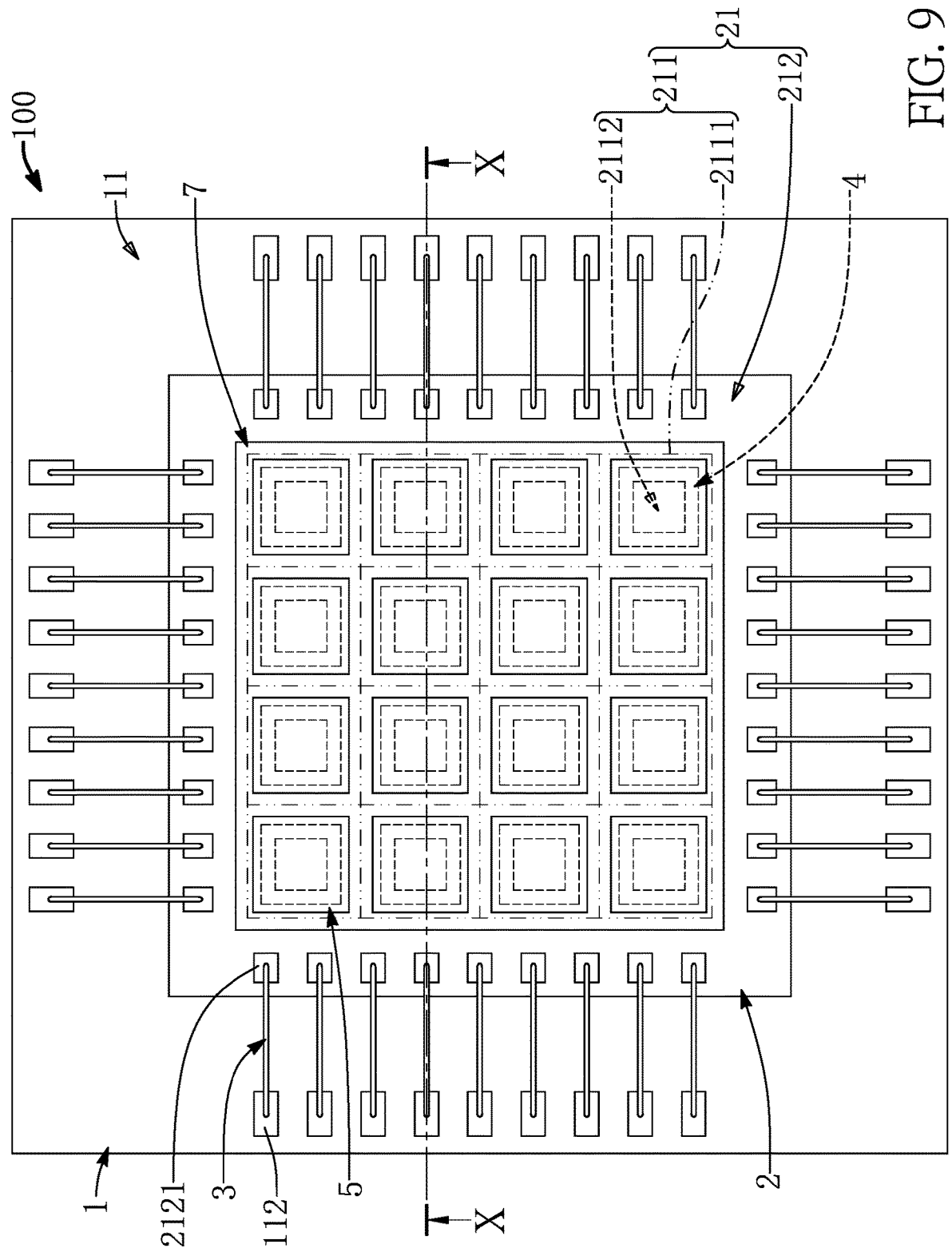
FIG. 9 is a schematic top view of FIG. 8.
Figure 10:
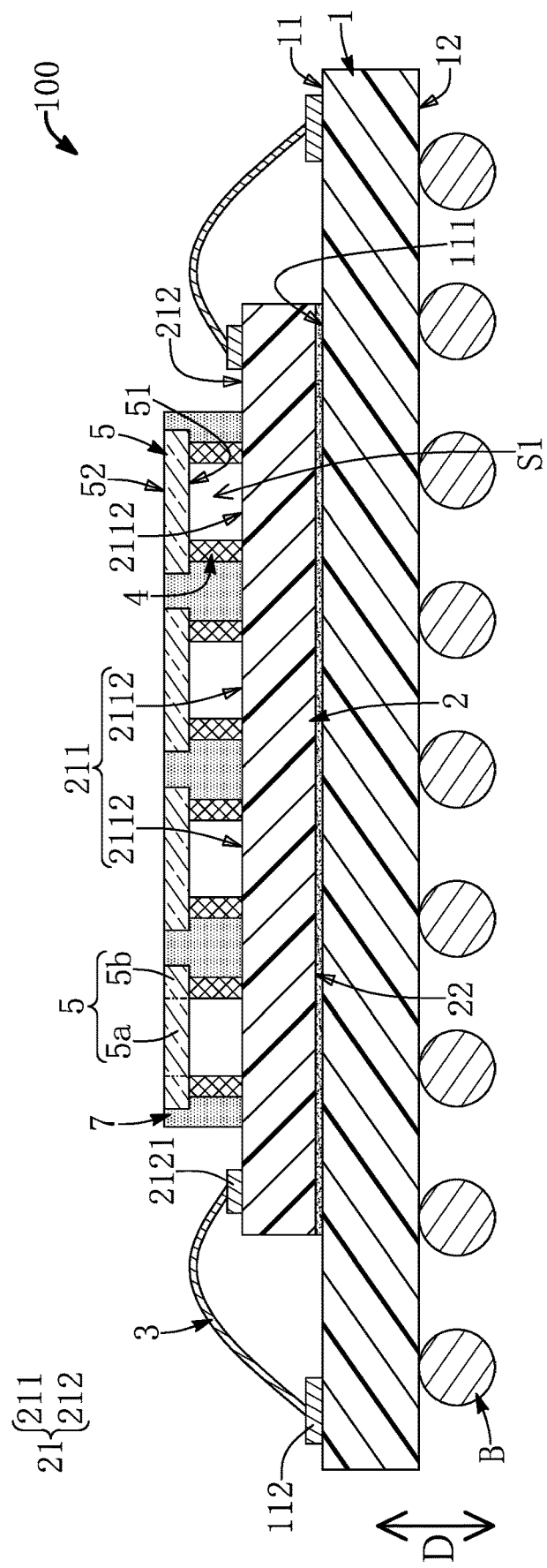
FIG. 10 is a schematic cross-sectional view taken along line X-X of FIG. 9.

Referring to FIG. 8 to FIG. 10, a fourth embodiment of the present disclosure, which is similar to the first embodiment of the present disclosure, is provided. For the sake of brevity, descriptions of the same components in the first and fourth embodiments of the present disclosure will be omitted herein, and the following description only discloses different features between the first and fourth embodiments.

In the present embodiment, the sensor package structure 100 uses a light absorption layer 7 to replace the encapsulant 6 of the first embodiment as shown in FIG. 3. The light absorption layer 7 in the present embodiment is integrally formed as a single one-piece structure and is only formed on the top surface 21 of the sensor chip 2, so that the metal wires 3 of the sensor package structure 100 are exposed in an external environment (e.g., two ends of each of the metal wires 5 are respectively connected to the substrate 1 and the peripheral region 212 of the sensor chip 2, and each of the metal wires 5 is not in contact with other components).

Specifically, the light absorption layer 7 is formed on the layout boundary 2111 of the sensor chip 2, and a surrounding lateral surface of each of the filtering lenses 5 and an outer lateral edge of each of the adhesive rings 4 are covered by the light absorption layer 7. In other words, the outer surfaces 52 of the filtering lenses 5 are exposed in the external environment, and the light absorption layer 7 of the sensor package structure 100 can be provided for blocking light, so that the light can travel to any one of the sub-regions 2112 only by passing through the outer surface 52 of the corresponding filtering lens 5.

Moreover, a space between any two of the adhesive rings 4 adjacent to each other and a space between any two of the filtering lenses 5 adjacent to each other are fully filled with the light absorption layer 7, and the light absorption layer 7 preferably does not cover the outer surface 52 of each of the filtering lenses 5, but the present disclosure is not limited thereto. For example, in other embodiments of the present disclosure not shown in the drawings, the space between any two of the filtering lenses 5 adjacent to each other are not filled with the light absorption layer 7; or, at least part of the peripheral region 212 of the sensor chip 2 can be covered by the light absorption layer 7.

It should be noted that a quantity of the sub-regions 2112 of the sensing region 211 is L in number, a quantity of the filtering lenses 5 is M in number, and the filtering lenses 5 are configured to allow lights having N number of different wavelengths to pass therethrough. In other words, the filtering lenses 5 has N number of filtering configurations different from each other. Moreover, L, M, and N are positive integers greater than one, L is greater than or equal to M, and M is greater than or equal to N. The filtering lenses 5 in the present embodiment include, but is not limited to, at least one of a near-infrared light filtering lens, a red light filtering lens, a green light filtering lens, and a blue light filtering lens. In other embodiments of the present disclosure, the filtering lens 5 can correspond to light of wavelength other than that of the above lights.

In the present embodiment, L is equal to M (e.g., any one of the sub-regions 2112 carries or is provided with one of the adhesive rings 4 and one of the filtering lenses 5), and M is equal to N (e.g., any two of the filtering lenses 5 are respectively configured to allow lights of different wavelengths to pass therethrough), but the present disclosure is not limited thereto. For example, in other embodiments of the present disclosure not shown in the drawings, M can be greater than N. In other words, at least two of the filtering lenses 5 enable lights of same wavelength to pass therethrough according to design requirements.

Fifth Embodiment

Figure 11:
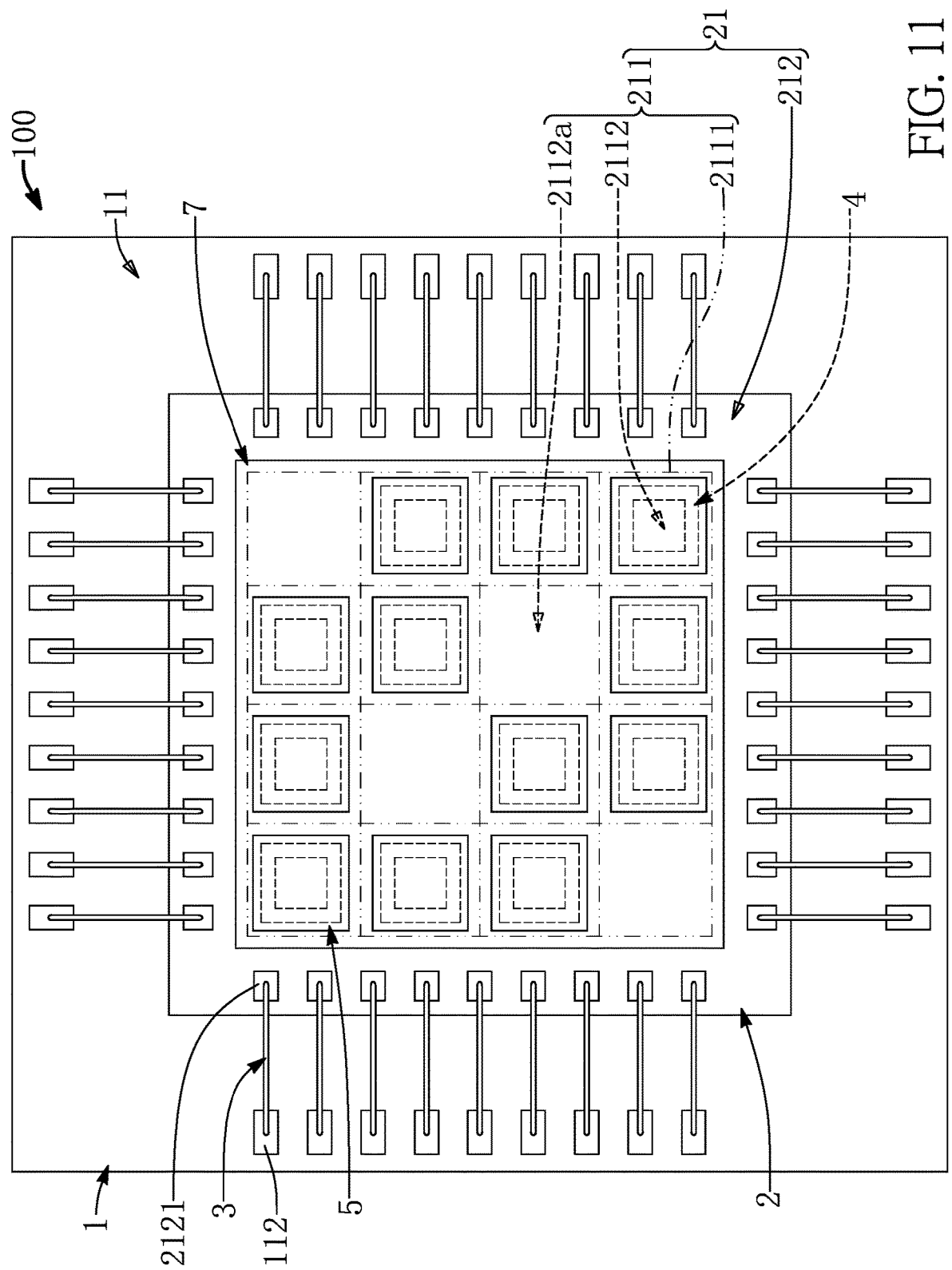
FIG. 11 is a schematic top view of the sensor package structure according to a fifth embodiment of the present disclosure.

Referring to FIG. 11, a fifth embodiment of the present disclosure, which is similar to the fourth embodiment of the present disclosure, is provided. For the sake of brevity, descriptions of the same components in the fourth and fifth embodiments of the present disclosure will be omitted herein, and the following description only discloses different features between the fourth and fifth embodiments.

In the present embodiment, a quantity of the sub-regions 2112 is greater than a quantity of the filtering lenses 5 (i.e., L is greater than M). In other words, at least one of the sub-regions 2112a can be provided for no sensing requirement and does not carry the adhesive rings 4 and the filtering lenses 5 thereon. Specifically, at least one of the sub-regions 2112a that does not have the adhesive rings 4 and the filtering lenses 5 disposed thereon is covered by the light absorption layer 7.

Sixth Embodiment

Referring to FIG. 11, a fifth embodiment of the present disclosure, which is similar to the fourth and fifth embodiments of the present disclosure, is provided. For the sake of brevity, descriptions of the same components in the fourth to sixth embodiments of the present disclosure will be omitted herein, and the following description only discloses different features among the fourth to sixth embodiments.

In the present embodiment, the sensor package structure 100 further includes a frame 8 and a light-permeable sheet 9 (e.g., a transparent glass) that is assembled to the frame 8. The frame 8 is disposed on the substrate 1 and surrounds the metal wires 3, and outer lateral surfaces of the frame 8 are preferably flush with the edges of the substrate 1.

Moreover, the light-permeable sheet 9 is fixed onto a top end of the frame 8. The substrate 1, the frame 8, and the light-permeable sheet 9 jointly define an enclosed space S2, and the sensor chip 2, the adhesive rings 4, the filtering lenses 5, the light absorption layer 7, and the metal layers 3 are arranged in the enclosed space S2.

Figure 12:
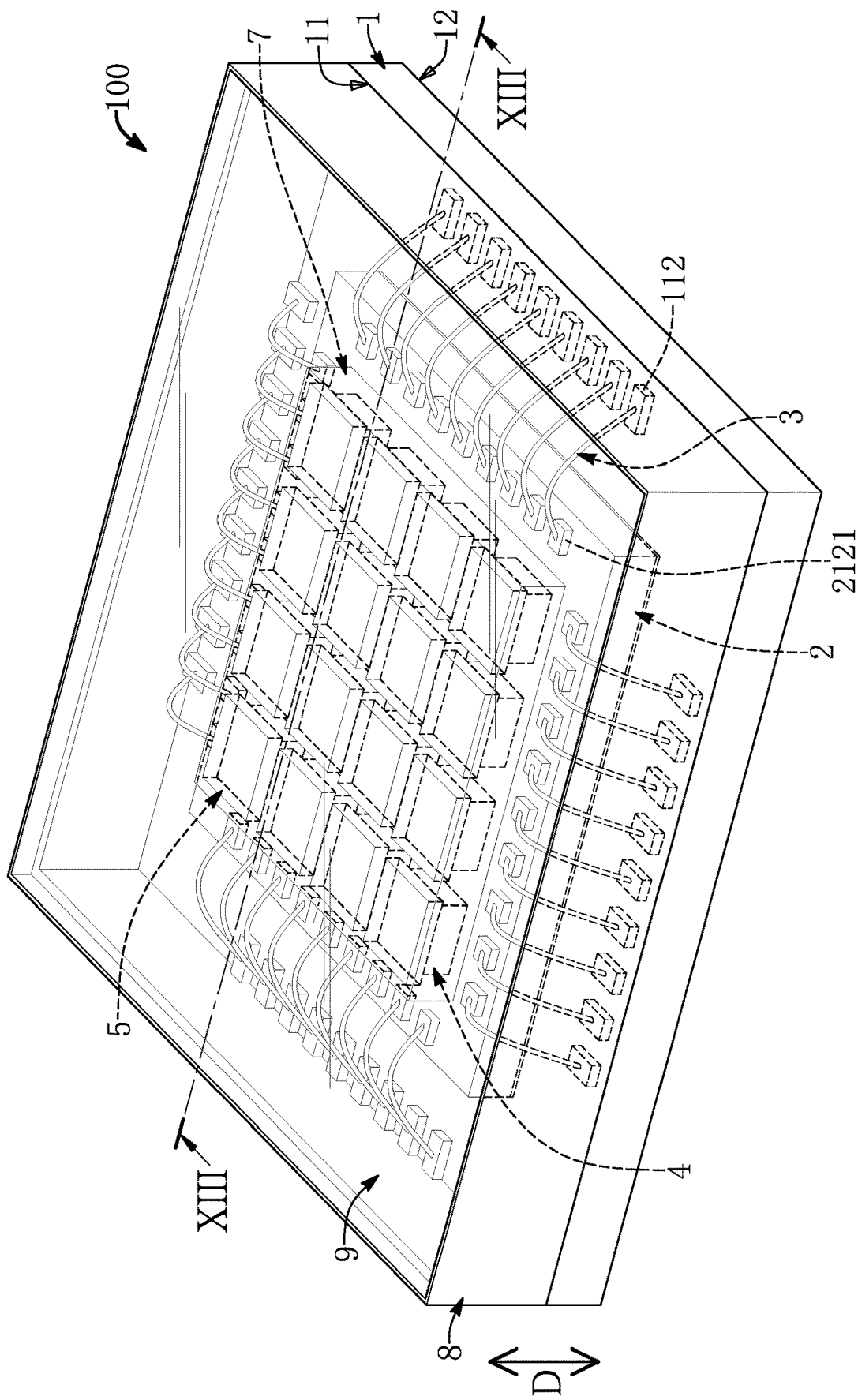
FIG. 12 is a schematic perspective view of the sensor package structure according to a sixth embodiment of the present disclosure.
Figure 13:
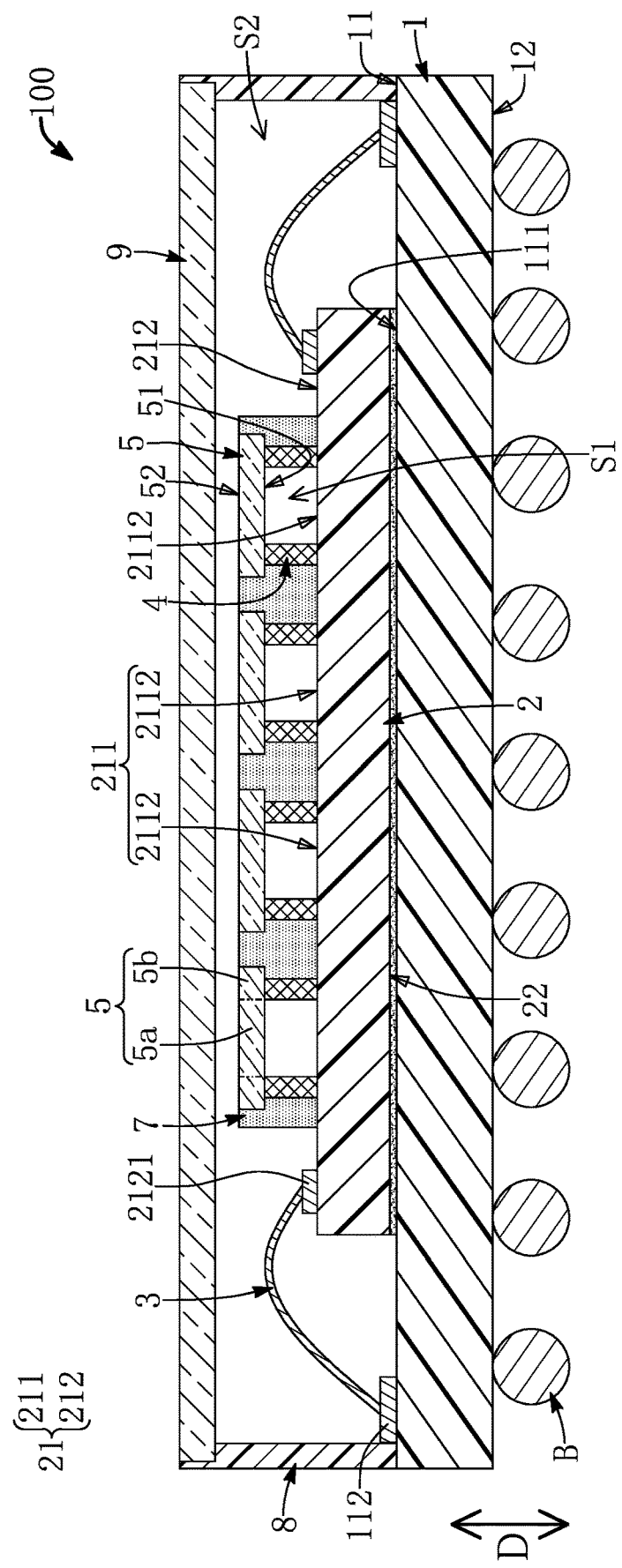
FIG. 13 is a schematic cross-sectional view taken along line XIII-XIII of FIG. 12.
Figure 14:
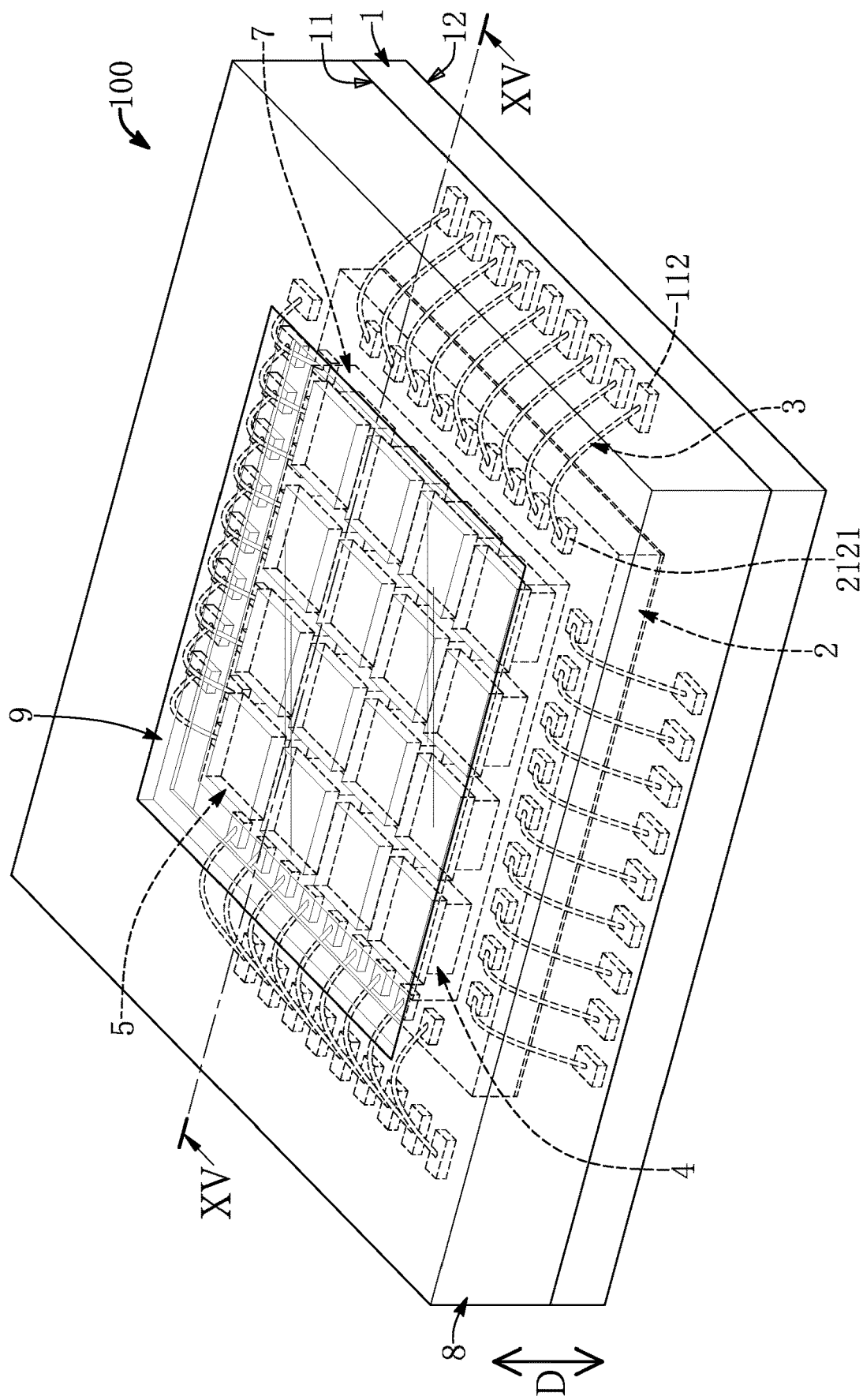
FIG. 14 is a schematic perspective view of the sensor package structure in another configuration according to the sixth embodiment of the present disclosure.
Figure 15:
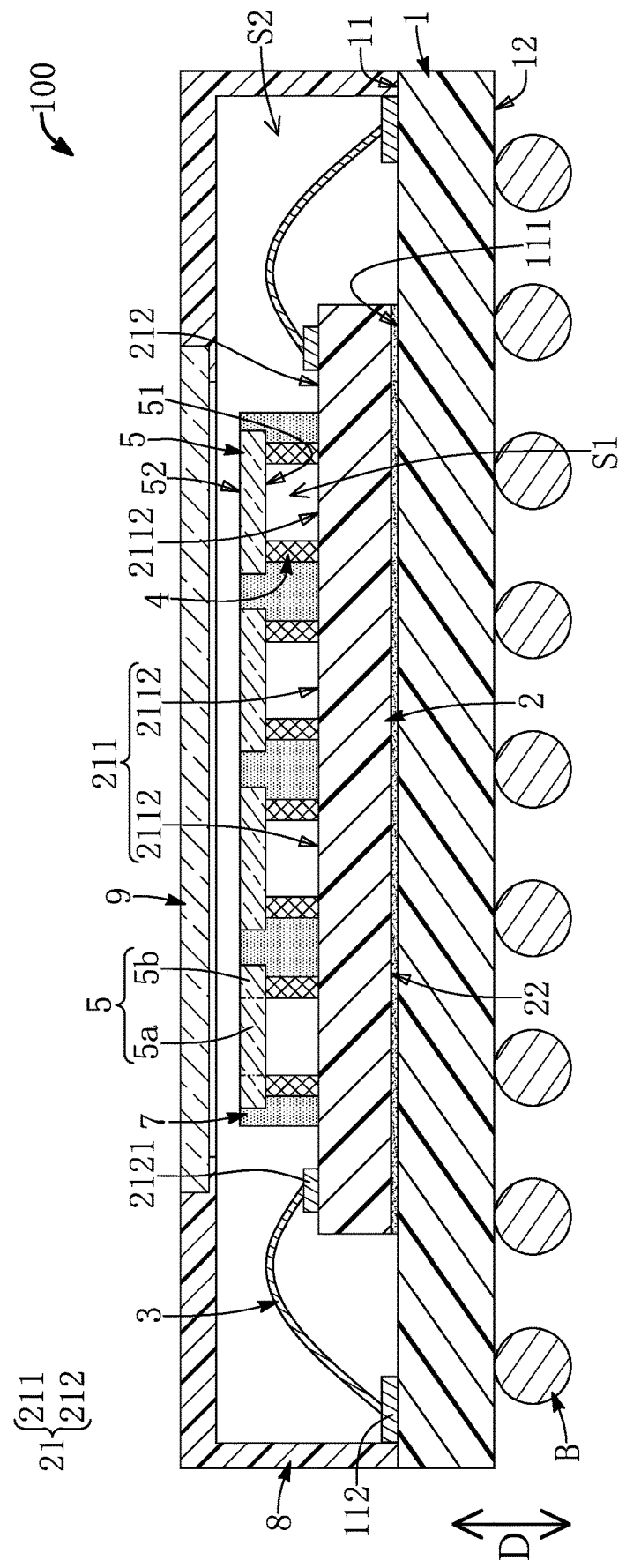
FIG. 15 is a schematic cross-sectional view taken along line XV-XV of FIG. 14.

Specifically, the size of the light-permeable sheet 9 can be adjusted or changed according to design requirements, but the present disclosure is not limited thereto. For example, as shown in FIG. 12 and FIG. 13, the size of the light-permeable sheet 9 can be substantially identical to (or slightly smaller than) that of the substrate 1; or, as shown in FIG. 14 and FIG. 15, a projection region defined by orthogonally projecting the light-permeable sheet 9 onto the top surface 21 of the sensor chip 2 overlaps the sensing region 211 and does not overlap the peripheral region 212, thereby effectively preventing light passing through from traveling to any one of the metal wires 3.

Beneficial Effects of the Embodiments

In conclusion, in the sensor package structure provided by the present disclosure, the filtering lenses are respectively disposed on the sub-regions of the sensor chip through adhesive rings, so that a sensing requirement for one kind of light can be met by one of the filtering lenses, thereby reducing the complexity and cost of manufacturing the sensor package structure under the condition that the sensing requirements of the sensor chip are met.

Moreover, in each of the filtering lenses, the corresponding adhesive ring, and the corresponding sub-region of the sensor package structure provided by the present disclosure, the adhesive ring has a larger CTE, and the buffering space can receive a thermal expansion portion of the adhesive ring, thereby preventing the filtering lens and the sub-region from being damaged by being squeezed as a result of the thermal expansion of the adhesive ring.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
a substrate;
a sensor chip disposed on and electrically coupled to the substrate, wherein a top surface of the sensor chip includes a sensing region and a peripheral region that is arranged outside of the sensing region, and wherein the sensing region defines a layout boundary and a plurality of sub-regions that are defined by the layout boundary and that are separate from each other;
a plurality of adhesive rings disposed on the sensing region, wherein each of the adhesive rings surrounds one of the sub-regions;
a plurality of filtering lenses respectively adhered to the adhesive rings, wherein each of the filtering lenses, a corresponding one of the adhesive rings, and a corresponding one of the sub-regions jointly define a buffering space, wherein M represents a quantity of the filtering lenses, the filtering lenses are configured to allow lights having N number of different wavelengths to pass therethrough, and wherein M and N are positive integers greater than one, and M is greater than or equal to N; and
an encapsulant being formed on the substrate and covering the peripheral region and the layout boundary of the sensor chip, wherein the sensor chip, the adhesive rings, and the filtering lenses are embedded in the encapsulant, and at least part of an outer surface of each of the filtering lenses is exposed from the encapsulant.

2. The sensor package structure according to claim 1, wherein each of the filtering lenses has a light-permeable segment and an assembling segment that surrounds the light-permeable segment, and each of the filtering lenses is adhered to the corresponding adhesive ring through the assembling segment thereof.

3. The sensor package structure according to claim 1, wherein the filtering lenses include at least one of a near-infrared light filtering lens, a red light filtering lens, a green light filtering lens, and a blue light filtering lens.

4. The sensor package structure according to claim 1, further comprising a plurality of metal wires, wherein two ends of each of the metal wires are respectively connected to the substrate and the peripheral region of the sensor chip, so that the substrate and the sensor chip are electrically coupled to each other, and wherein each of the metal wires is embedded in the encapsulant.

5. The sensor package structure according to claim 1, wherein L represents a quantity of the sub-regions of the sensing region, and wherein L is a positive integer greater than one, and L is equal to M.

6. The sensor package structure according to claim 1, wherein L represents a quantity of the sub-regions of the sensing region, wherein L is a positive integer greater than one, and L is greater than M, and wherein at least one of the sub-regions without having the adhesive rings and the filtering lenses disposed thereon is covered by the encapsulant.

7. The sensor package structure according to claim 1, wherein the encapsulant includes an extension portion, wherein the extension portion protrudes from the outer surfaces of the filtering lenses, so that the extension portion and the outer surface of each of the filtering lenses jointly define a light-permeable slot.

8. The sensor package structure according to claim 7, wherein each of the filtering lenses has a light-permeable segment and an assembling segment that surrounds the light-permeable segment, and each of the filtering lenses is adhered to the corresponding adhesive ring through the assembling segment thereof, and wherein the encapsulant covers the assembling segment of each of the filtering lenses, but is not in contact with the light-permeable segment.

9. The sensor package structure according to claim 7, wherein the adhesive rings are arranged in a projection space defined by orthogonally projecting the extension portion toward the top surface of the sensor chip.

10. The sensor package structure according to claim 7, wherein an inner side wall and a bottom wall of each of the light-permeable slots have an angle therebetween that is greater than or equal to 90 degrees.

11. A sensor package structure, comprising:
a substrate;
a sensor chip disposed on and electrically coupled to the substrate, wherein a top surface of the sensor chip includes a sensing region and a peripheral region that is arranged outside of the sensing region, and wherein the sensing region defines a layout boundary and a plurality of sub-regions that are defined by the layout boundary and that are separate from each other;
a plurality of adhesive rings disposed on the sensing region, wherein each of the adhesive rings surrounds one of the sub-regions;
a plurality of filtering lenses respectively adhered to the adhesive rings, wherein each of the filtering lenses, a corresponding one of the adhesive rings, and a corresponding one of the sub-regions are jointly define a buffering space, wherein M represents a quantity of the filtering lenses, the filtering lenses are configured to allow lights having N number of different wavelengths to pass therethrough, and wherein M and N are positive integers greater than one, and M is greater than or equal to N; and
a light absorption layer formed on the layout boundary of the sensor chip, wherein a surrounding lateral surface of each of the filtering lenses and an outer lateral edge of each of the adhesive rings are covered by the light absorption layer.

12. The sensor package structure according to claim 11, wherein a space between any two of the adhesive rings adjacent to each other is fully filled with the light absorption layer.

13. The sensor package structure according to claim 12, wherein the light absorption layer is integrally formed as a single one-piece structure, and a space between any two of the filtering lenses adjacent to each other is fully filled with the light absorption layer.

14. The sensor package structure according to claim 11, further comprising a plurality of metal wires, wherein two ends of each of the metal wires are respectively connected to the substrate and the peripheral region of the sensor chip, so that the substrate and the sensor chip are electrically coupled to each other.

15. The sensor package structure according to claim 14, further comprising:
a frame being disposed on the substrate and surrounding the metal wires; and
a light-permeable sheet assembled to the frame, wherein the substrate, the frame, and the light-permeable sheet jointly define an enclosed space, and the sensor chip, the adhesive rings, the filtering lenses, the light absorption layer, and the metal layers are arranged in the enclosed space.

16. The sensor package structure according to claim 15, wherein a projection region defined by orthogonally projecting the light-permeable sheet onto the top surface of the sensor chip overlaps with the sensing region and does not overlap with the peripheral region.

17. The sensor package structure according to claim 14, wherein outer surfaces of the filtering lenses and the metal wires are exposed in an external environment.

18. The sensor package structure according to claim 11, wherein at least part of the peripheral region is covered by the light absorption layer.

19. The sensor package structure according to claim 11, wherein L represents a quantity of the sub-regions of the sensing region, and wherein L is a positive integer greater than one, and L is equal to M.

20. The sensor package structure according to claim 11, wherein L represents a quantity of the sub-regions of the sensing region, wherein L is a positive integer greater than one, and L is greater than M, and wherein at least one of the sub-regions without having the adhesive rings and the filtering lenses disposed thereon is covered by the light absorption layer.

* * * * *